(12) United States Patent
Ziazadeh et al.

(10) Patent No.: US 6,606,001 B1
(45) Date of Patent: Aug. 12, 2003

(54) HIGH-SPEED CURRENT-MIRROR CIRCUITRY AND METHOD OF OPERATING THE SAME

(75) Inventors: Ramsin M. Ziazadeh, San Jose, CA (US); Jitendra Mohan, Santa Clara, CA (US); Devnath Varadarajan, Santa Clara, CA (US); Vjay Ceekala, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 114 days.

(21) Appl. No.: 10/000,195

(22) Filed: Oct. 25, 2001

(51) Int. Cl.[7] .................................................. H03F 3/04
(52) U.S. Cl. ...................... 330/288; 330/277; 330/292; 323/315; 327/538
(58) Field of Search ................................ 330/277, 288, 330/292; 323/315, 316; 327/538, 540, 541

(56) References Cited

U.S. PATENT DOCUMENTS

| | | | |
|---|---|---|---|
| 3,993,968 A | 11/1976 | Lee | 333/80 |
| 3,996,539 A | 12/1976 | Lee | 333/80 |
| 5,012,128 A | 4/1991 | Chan | 307/270 |
| 5,289,412 A | 2/1994 | Frary et al. | 365/185 |
| 6,066,993 A | 5/2000 | Yamamoto et al. | 333/103 |
| 6,369,657 B2 * | 4/2002 | Dening et al. | 330/296 |
| 6,414,553 B1 * | 7/2002 | Luo | 330/296 |
| 6,417,734 B1 * | 7/2002 | Luo et al. | 330/296 |
| 6,417,735 B1 * | 7/2002 | Luo | 330/296 |

* cited by examiner

Primary Examiner—Henry Choe
(74) Attorney, Agent, or Firm—Davis Munck, P.C.

(57) ABSTRACT

There is disclosed high-speed current-mirror circuitry and methods of operating the same. An exemplary impedance-peaking current mirror comprises a N-channel drive transistor and a N-channel mirror transistor. The N-channel drive transistor has a source coupled to ground, a drain coupled to a current source and a gate coupled to the drain via a series connection of a resistor and an inductor. The N-channel mirror transistor has a source coupled to ground, a gate coupled to the drain of the N-channel drive transistor, and a drain coupled to a positive power supply via an impedance load.

20 Claims, 7 Drawing Sheets

US 6,606,001 B1

HIGH-SPEED CURRENT-MIRROR CIRCUITRY AND METHOD OF OPERATING THE SAME

TECHNICAL FIELD OF THE INVENTION

The present invention is generally directed to electronic circuits and methods, more specifically, to a high-speed current-mirror circuitry and method of operating the same.

BACKGROUND OF THE INVENTION

Current-mirror circuits are one of the basic building blocks of integrated circuits. Broadly, a current-mirror circuit is operable to reproduce, or mirror, a reference (or drive) current at one location in the circuit at another location within the circuit.

Ideally, the current mirror circuit would be operable to mirror a reference current directly, as mirrored currents should be independent of a load at the mirror points and any given supply voltage. Conventionally, ideal conditions do not exist, and it is only possible to get very close to these objectives.

For purposes of illustration, FIG. 1 is introduced to illustrate a PRIOR ART high-speed current-mirror circuit (generally designated 100). PRIOR ART current-mirror circuit 100 includes two N-channel transistors, namely a N-channel drive transistor 105a and a N-channel mirror transistor 105b. Drive transistor 105a has source 110a coupled to ground, and drain 115a and gate 120a each coupled to each other and to current source 130. Mirror transistor 105b has source 110b coupled to ground, drain 115b coupled to a positive power supply, VDD, via impedance load 135, and gate 120b coupled to drain 115a and gate 120a of drive transistor 105a.

Current source 130 is illustrated as a generic device comprising a DC current source 131, which produces a DC bias current, I, and an AC signal source 132, which produces an AC signal current, i(ac). The combined output current of current source 130, I+i(ac), flows through drive transistor 105a.

Drive transistor 105a is in a diode-connected configuration and provides the biasing for mirror transistor 105b. Because is mirror transistor 105b has the same gate-to-source voltage as drive transistor 105a, the drain current in mirror transistor 105b (i.e., the mirror current, I(m)) is give by N[I+i(ac)], where N is a scale factor determined by the relative sizes of drive transistor 105a and mirror transistor 105b. If drive transistor 105a and mirror transistor 105b are identical devices, then N=1, and the mirror current in mirror transistor 105b is the same as the drive current in drive transistor 105a, so that I(m)=I+i(ac).

Drive transistor 105a drives its own gate capacitance because drain 115a is coupled to gate 120a, as well as mirror transistor 105b, effectively driving two gate capacitances. The maximum operating frequency ("f(max1)") of drive transistor 105a is defined as the transconductance of drive transistor 105a ("Gm") divided by its total gate and drain capacitances.

For drive transistor 105a, the total capacitance, C(total1), is given by:

$$C(total1) = Cgs + Cgb + Cgd + Cjd + Cdb.$$

Note that Cgd is 0, because the gate and drain are shorted. For mirror transistor 105b, the total capacitance, C(total2), is given by:

$$C(total2) = Cgs + Cgb + Cgd.$$

Drive transistor 105a sees the following load:

$$C(total1) + C(total2),$$

and the maximum frequency, f(max2), is given by:

$$Gm/[C(total1) + C(total2)].$$

However, since the gate-to-source capacitance of the device is the dominant capacitance when it is operating in saturation region, the maximum frequency can be approximated to Gm of the device divided by the gate-to-source capacitance of the device.

Thus, generally speaking, the maximum operating frequency achievable by PRIOR ART current-mirror circuit 100 is the Gm of drive transistor 105a divided by the two gate capacitances, reducing the maximum operating frequency to f(max1)/2 (e.g., for a 10 GHz application, PRIOR ART current-mirror circuit 100 may operate at approximately 5 GHz).

Conventional methods for mirroring current in high frequency applications often suffer because the drive transistor drives two gate-capacitances thereby limiting the maximum frequency operation to f(max2)=f(max1)/2. There is a need in the art for improved high-speed current-mirror circuitry that operates well in current and next-generation applications that require high frequency operations close to f(max1).

SUMMARY OF THE INVENTION

To address the above-discussed deficiencies of the prior art, it is a primary object of the present invention to provide high-speed current-mirror circuitry and a method of operating the same. According to one exemplary embodiment, an impedance-peaking current mirror comprises a N-channel drive transistor and a N-channel mirror transistor. The N-channel drive transistor has a source coupled to ground, a drain coupled to a current source and a in gate coupled to the drain via a series connection of a resistor and an inductor. The N-channel mirror transistor has a source coupled to ground, a gate coupled to the drain of the N-channel drive transistor, and a drain coupled to a positive power supply via an impedance load.

According to another exemplary embodiment, an impedance-peaking current mirror comprises a P-channel drive transistor and a P-channel mirror transistor. The P-channel drive transistor has a source coupled to a positive power supply, a drain coupled to a current source and a gate coupled to the drain via a series connection of a resistor and an inductor. The P-channel mirror transistor has a source coupled to the positive power supply, a gate coupled to the drain of the P-channel drive transistor, and a drain coupled to ground via an impedance load.

An important aspect of both embodiments occurs when the impedance-peaking current mirror operates at a sufficiently high frequency to increase the impedance of the inductor such that the inductor isolates the gate to source capacitance of the drive transistor from the gate to source capacitance of the mirror transistor at relatively high frequencies. At high frequencies, a voltage boost is accordingly provided to the mirror transistor to thereby enable operation at frequencies greater than f(max1)/2.

The exemplary inductor may suitably be an on-chip low-Q inductor and the exemplary resistor may suitably be a MOS, polysilcon, or like resistor. The series connection of the inductor and the resistor of the current-mirror circuits provide frequency operation of greater than f(max1)/2, while advantageously preserving the advantages of conventional current-mirror circuits, such as was illustrated with reference to FIG. 1.

Stated differently, the illustrated embodiment cooperatively uses the inductor and the resistor to provide impedance peaking at bandwidths greater than f(max1)/2 as well as damping control. The inductor operates to tune out and isolate the gate capacitances associated with the current mirror and, the resistor operates to further isolate the gate capacitances and control the damping of the LC tank circuit.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; and the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

FIGS. 2 through 6, discussed below, and the various embodiments used to describe the principles of the present invention in this patent document are by way of illustration only and should not be construed in any way to limit the scope of the invention.

Figure 2:
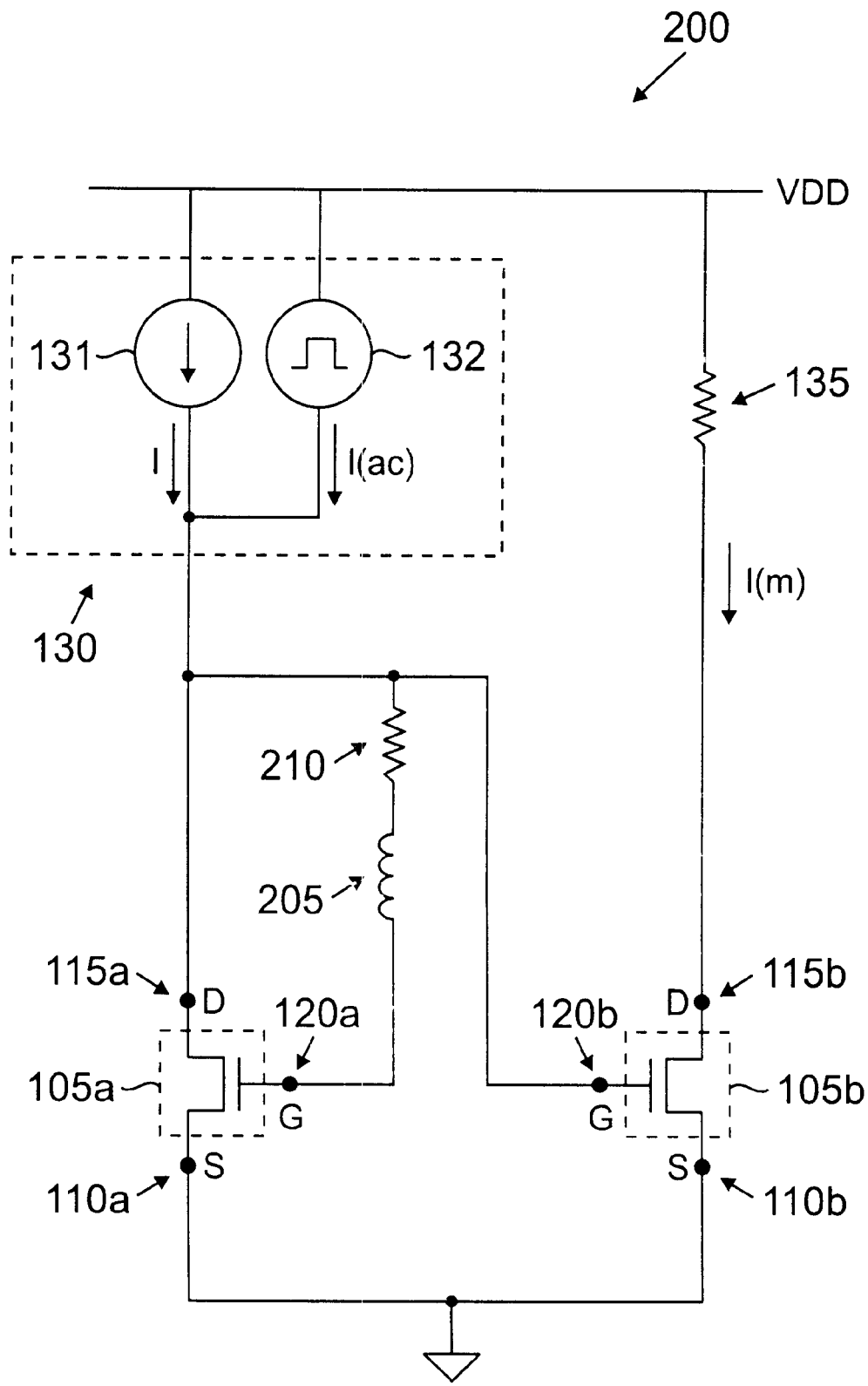
FIG. 2 illustrates an exemplary embodiment of a high-speed current-mirror circuit including two N-type transistors and a low-Q inductor in accordance with the principles of the present invention.

Turning initially to FIG. 2, illustrated is an exemplary embodiment of a high-speed current-mirror circuit (generally designated 200) in accordance with the principles of the present invention. Exemplary current-mirror circuit 200 includes two N-channel transistors, namely a N-channel drive transistor 105a and a N-channel mirror transistor 105b. Drive transistor 105a again has source 110a coupled to ground, and drain 115a and gate 120a each coupled to current source 130. Gate 120a however is coupled to drain 115a via a series connection of an inductor 205 and a resistor 210. Mirror transistor 105b again has source 110b coupled to ground, drain 115b coupled to a positive power supply, VDD, via impedance load 135, and gate 120b coupled to drain 115a of drive transistor 105a.

Figure 1:
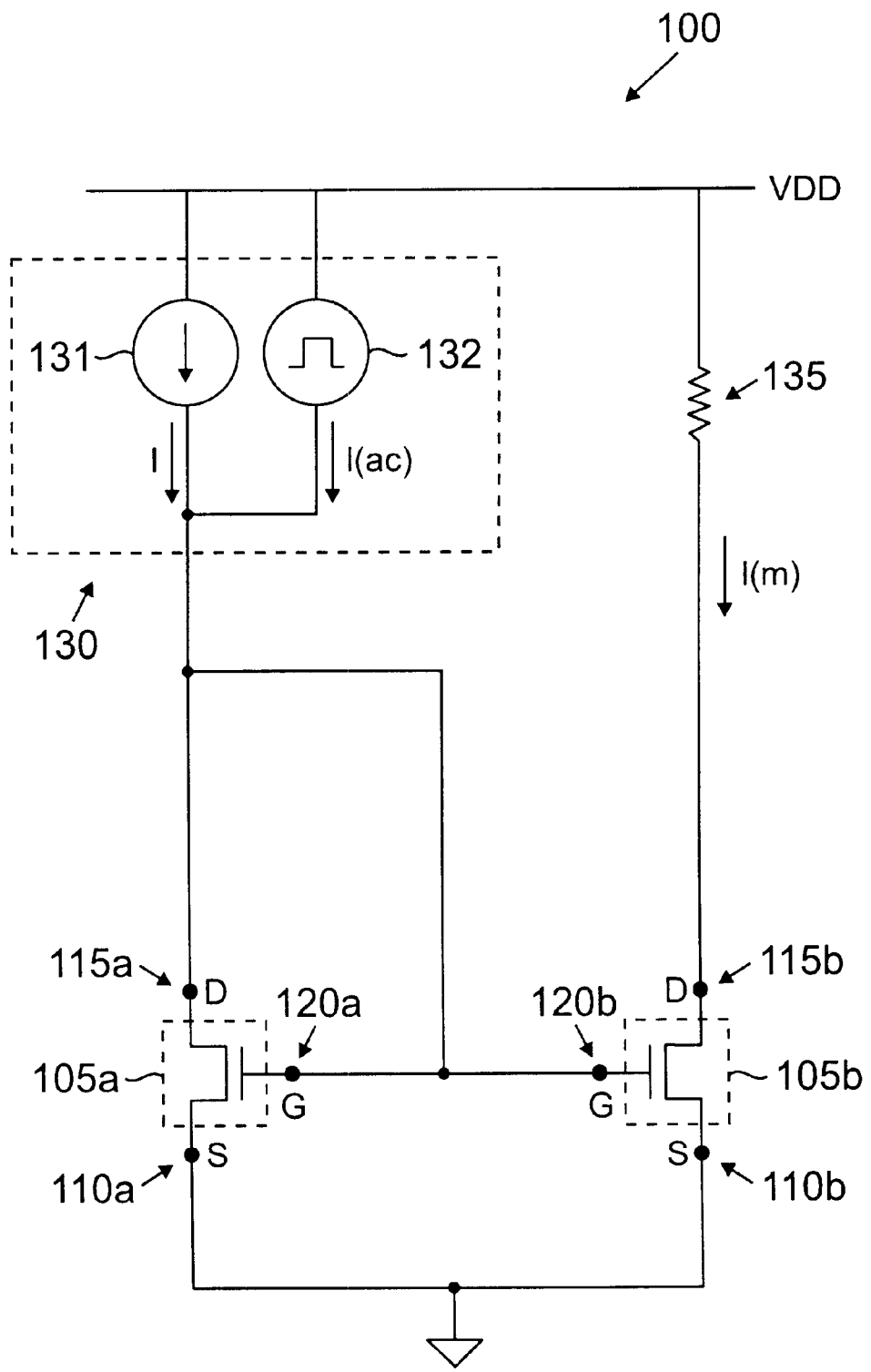
FIG. 1 illustrates a PRIOR ART high-speed current-mirror circuit.

According to an advantageous embodiment, exemplary inductor 205 may suitably be an on-chip low-Q inductor and exemplary resistor 210 may suitably be a MOS, polysilcon, or like resistor. The series connection of inductor 205 and resistor 210 of current-mirror circuit 200 provides frequency operation of greater than f(max1)/2, while advantageously preserving the advantages of conventional current-mirror circuits, such as was illustrated with reference to FIG. 1.

The illustrated embodiment cooperatively uses inductor 205 and resistor 210 to provide impedance peaking at bandwidths greater than f(max1)/2 and damping control. Inductor 205 operates to tune out and isolate the gate capacitances associated with the current mirror and, resistor 210 operates to further isolate the gate capacitances and control the damping of the LC tank circuit. At high frequencies, a voltage boost is provided to mirror transistor 105b to thereby enable operation at frequencies greater than f(max1)/2.

Figure 3:
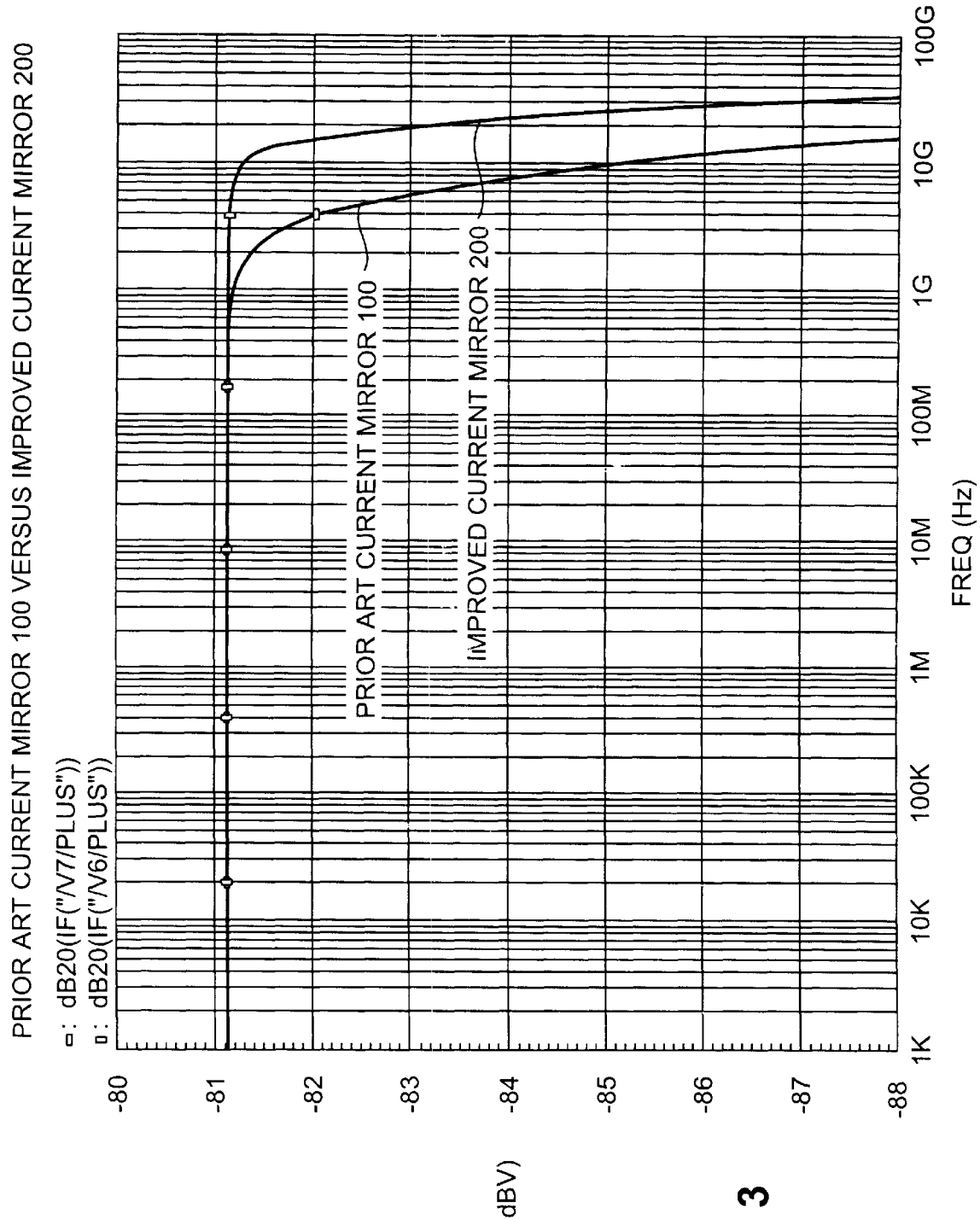
FIG. 3 illustrates an exemplary graphical representation comparing the operation of the PRIOR ART high-speed current-mirror circuit of FIG. 1 and the high-speed current-mirror circuit including the two N-type transistors and the low-Q inductor according to one embodiment of the present invention.

Turning next to FIG. 3, illustrated is an exemplary graphical representation that compares the operation of PRIOR ART current-mirror circuit 100 and improved high-speed current-mirror circuit 200 according to one embodiment of the present invention.

In operation, PRIOR ART current-mirror circuit 100 has no direct current ("DC") flowing through drive transistor 105a drain 115a to gate 120a connection, though alternating current ("AC") is induced due to the gate capacitances of drive transistor 105a and mirror transistor 105b at high frequencies. Thus, the input current splits into three branches, two of which are undesired.

Current-mirror circuit 200 operates (and behaves) the same as PRIOR ART current-mirror circuit 100 at low frequencies, again since there is no DC current flowing through inductor 205 and resistor 210 from drain 115a to gate 120a of drive transistor 105a. At high frequencies, however, inductor 205 and resistor 210 cooperatively provide an open circuit for the current to flow through the gate capacitance of drive transistor 105a. Inductor 205 concurrently operates to tune out the capacitance associated with the gate capacitance of mirror transistor 105b to provide high frequency operation (preferably, close to f(max1)).

Figure 4A:
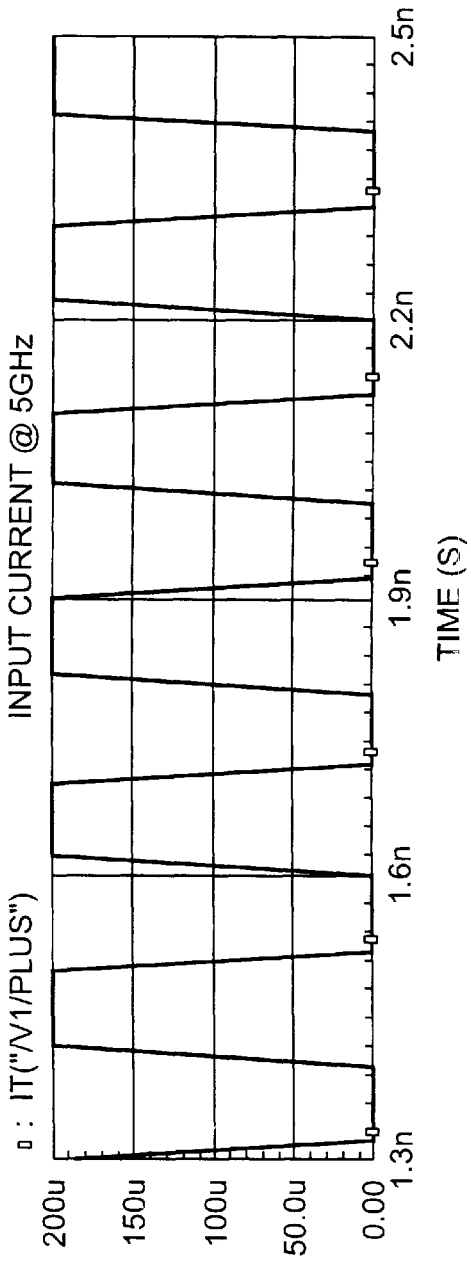
FIGS. 4A to 4C respectively illustrate exemplary graphical representations of (i) a input current of 5 GHz, (ii) an output current resulting from the operation of the PRIOR ART high-speed current-mirror circuit of FIG. 1, and (iii) an output current resulting from the operation of the high-speed current-mirror circuit including the two N-type transistors and the low-Q inductor according to one embodiment of the present invention.
Figure 4B:
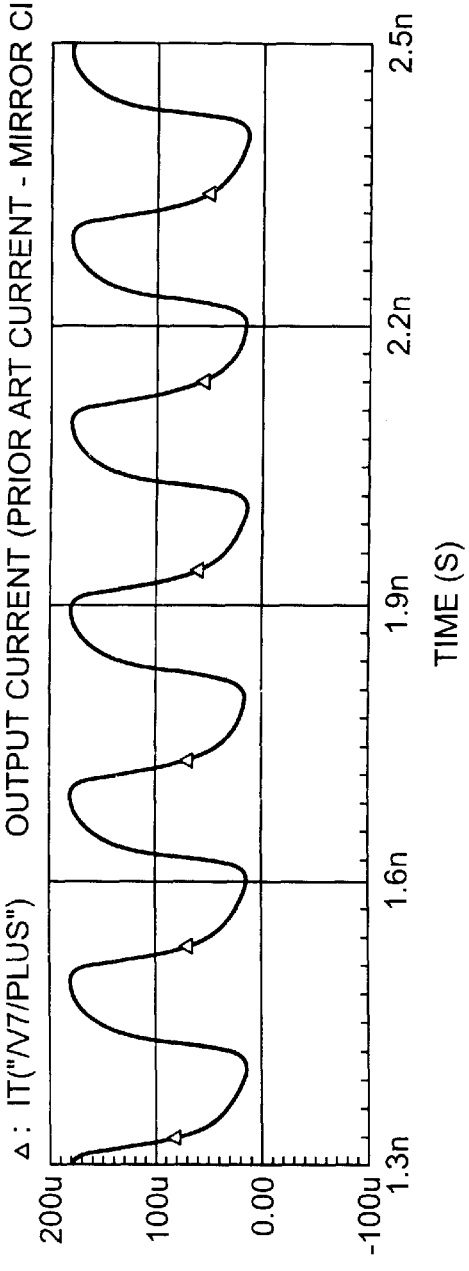
Figure 4C:
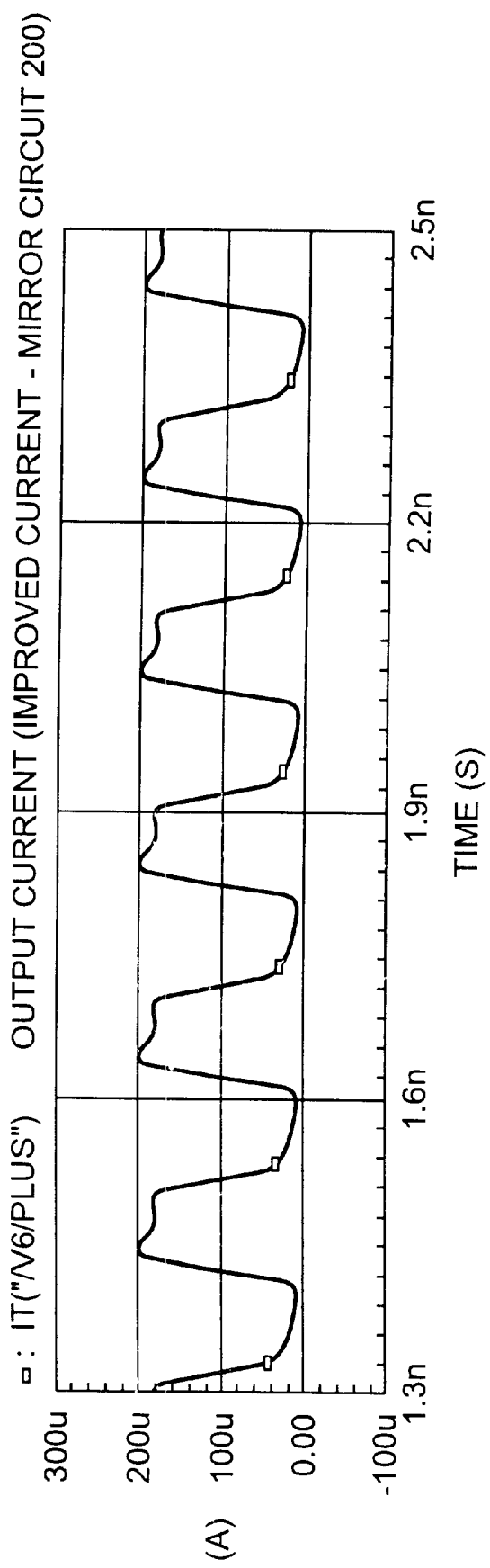

Turning concurrently to FIGS. 4A to 4C, respectively illustrated are exemplary graphical representations of (i) a input current of 5 GHz, (ii) an output current resulting from the operation of PRIOR ART high-speed current-mirror circuit 100, and (iii) an output current resulting from the operation of high-speed current-mirror circuit 200 according to one embodiment of the present invention. According to the illustrated representations, both current-mirror circuits are simulated using an input current frequency of 5 GHz. The input current consists of a square pulse of a 50% duty cycle with rise and fall times of 20 ps with a pulse width of 80 ps and a period of 200 ps (5 GHz).

Figure 5:
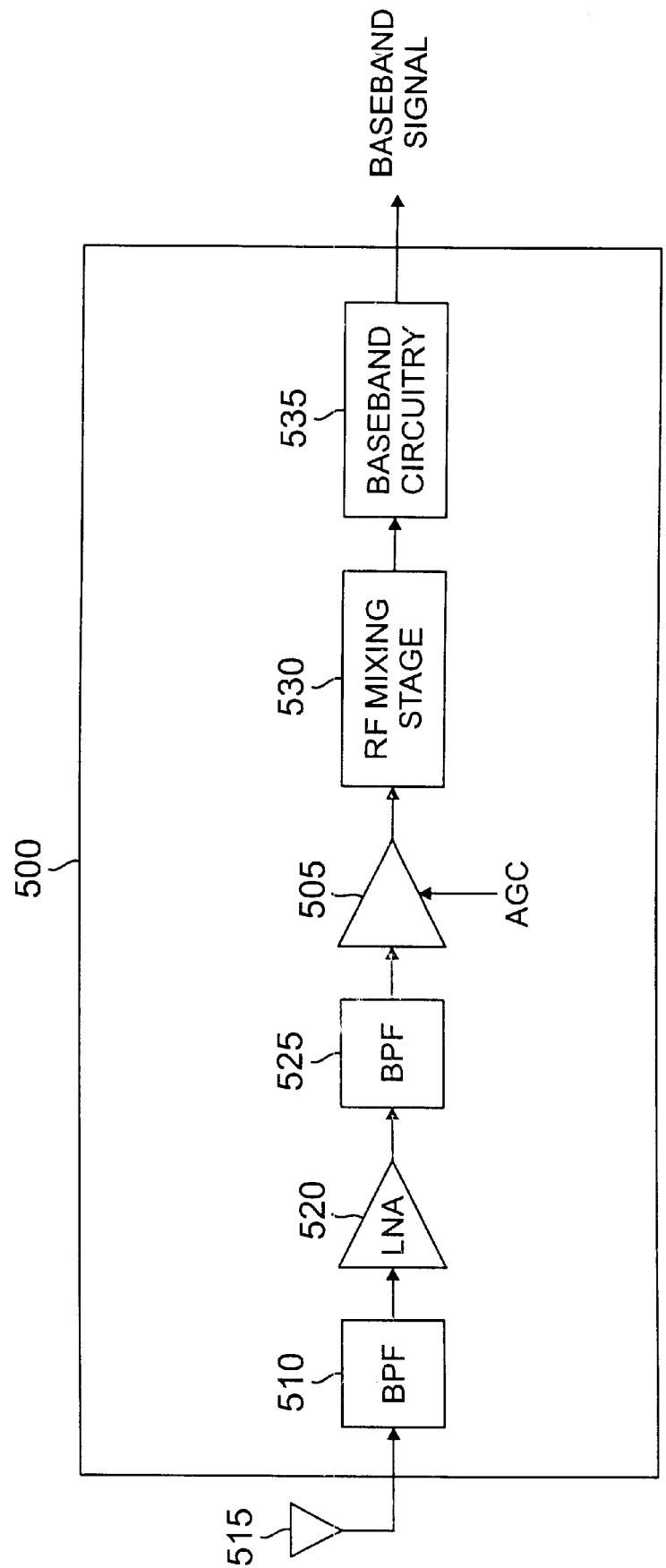
FIG. 5 schematically illustrates an exemplary embodiment of selected portions of the receive signal path of a receiver having a transistor amplifier stage according to one embodiment of the present invention.

Turning next to FIG. 5, schematically illustrated is an exemplary embodiment of selected portions of the receive signal path of a receiver 500 having an amplifier stage 505 according to one embodiment of the present invention. Exemplary receiver 500 and amplifier stage 505 provide, both separately and collectively, a suitable environment in which the principles of the present invention may be arranged.

Those skilled in the art will recognize that receiver 500 and amplifier stage 505 are provided as examples only and that various alternate embodiments may suitably be arranged to incorporate the principles of the present invention. To that end, current-mirror circuit 200 may be suitably associated with any of the elements of any device, such as amplifier stage 505 of receiver 500, utilizing current-mirror circuitry for frequencies greater than f(max1)/2.

For the purposes hereof, it is assumed that exemplary receiver 500 may be implemented in any conventional suitably arranged one-way or two-way communication device, including a cellular telephone, a wireless network card, a two-way pager, or the like. For the purpose of simplifying the explanation of the present invention, the transmitter portion of a two-way communication embodiment is not shown.

The receive path through receiver 500 comprises band pass filter (BPF) 510, which receives an incoming signal from antenna 515. The receive path further comprises low-noise amplifier (LNA) 515, band pass filter (BPF) 520, amplifier stage 505, radio frequency (RF) mixing stage 530, and baseband circuitry 535. LNA 515 amplifies the filter RF output of BPF 510. BPF 525 further filters the amplified RF output of LNA 515 to remove noise signals introduced by, or amplified by, LNA 515 and to further isolate the frequencies of interest. Amplifier stage 515 amplifies the filtered RF output from BPF 525 to a suitable mixing level according to the value of an automatic gain control (AGC) signal applied to amplifier stage 505. The output of amplifier stage 505 is then mixed (e.g., down-converted) by RF mixing stage 530 to produce, for example, an intermediate frequency (IF) signal. The IF signal is then processed by baseband circuitry 535 to produce a final baseband signal. According to alternate embodiments of the present invention, one or more of BPF 510 and BPF 525 may be other types of filters, including low pass filters.

Figure 6:
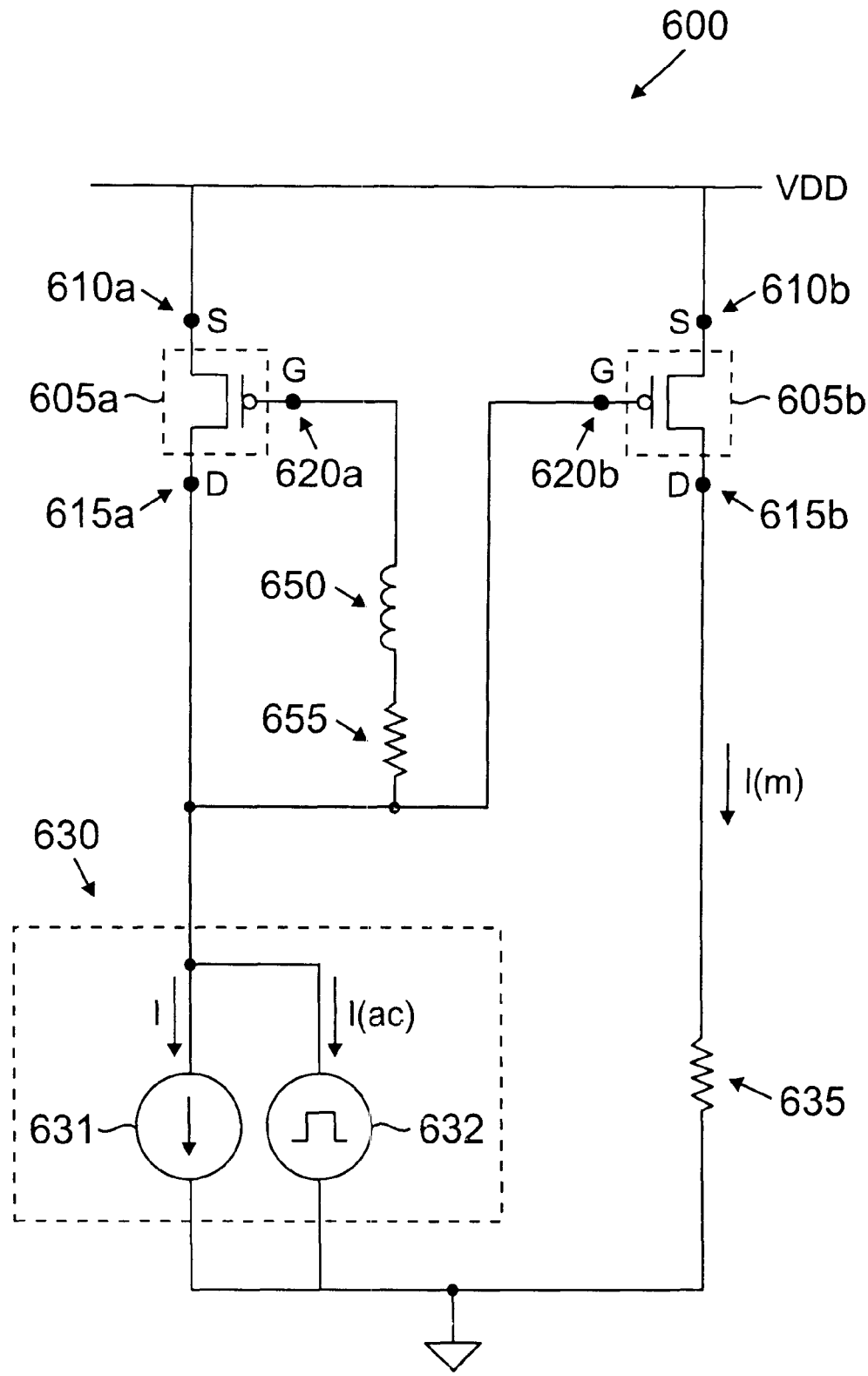
FIG. 6 illustrates an alternate exemplary embodiment of a high-speed current-mirror circuit including two P-type transistors and a low-Q inductor in accordance with the principles of the present invention.

Turning next to FIG. 6, illustrated is an alternate exemplary embodiment of a high-speed current-mirror circuit (generally designated 600) in accordance with the principles of the present invention. Current mirror circuit 600 is implemented using P-channel transistors rather than N-channel transistors. Exemplary current-mirror circuit 600 comprises P-channel drive transistor 605a and P-channel mirror transistor 605b. Drive transistor 605a has source 610a coupled to the VDD power supply, and drain 615a and gate 620a each coupled to ground via current source 630. Gate 620a, however, is coupled to drain 615a via a series connection of inductor 650 and resistor 655. Mirror transistor 605b has source 610b coupled to the VDD power supply, drain 615b coupled to ground via impedance load 635, and gate 620b coupled to drain 615a of drive transistor 605a.

Although the present invention has been described in detail, those skilled in the art should understand that they can make various changes, substitutions and alterations herein without departing from the spirit and scope of the invention in its broadest form.

What is claimed is:

1. An impedance-peaking current mirror comprising:
   a N-channel drive transistor having a source coupled to ground, a drain coupled to a current source and a gate coupled to said drain via a series connection of a resistor and an inductor; and
   a N-channel mirror transistor having a source coupled to ground, a gate coupled to said drain of said N-channel drive transistor, and a drain coupled to a positive power supply via an impedance load.

2. The impedance-peaking current mirror as set forth in claim 1 wherein said series connection of said resistor and said inductor operate as a short circuit at relatively low frequencies such that the gate to source voltage of said drive transistor is substantially equal to the gate to source voltage of said mirror transistor at relatively low frequencies.

3. The impedance-peaking current mirror as set forth in claim 2 wherein said series connection of said resistor and said inductor operate as a high impedance at relatively high frequencies, thereby isolating the gate to source capacitance of said drive transistor from the gate to source capacitance of said mirror transistor at relatively high frequencies.

4. An amplifier having a plurality of amplification stages, at least one of said amplification stages having an impedance-peaking current mirror comprising:
   a N-channel drive transistor having a source coupled to ground, a drain coupled to a current source and a gate coupled to said drain via a series connection of a resistor and an inductor; and
   a N-channel mirror transistor having a source coupled to ground, a gate coupled to said drain of said N-channel drive transistor, and a drain coupled to a positive power supply via an impedance load.

5. The amplifier as set forth in claim 4 wherein said series connection of said resistor and said inductor operate as a short circuit at relatively low frequencies such that the gate to source voltage of said drive transistor is substantially equal to the gate to source voltage of said mirror transistor at relatively low frequencies.

6. The amplifier as set forth in claim 5 wherein said series connection of said resistor and said inductor operate as a high impedance at relatively high frequencies, thereby isolating the gate to source capacitance of said drive transistor from the gate to source capacitance of said mirror transistor at relatively high frequencies.

7. A receiver comprising:
   a receiver front-end circuit capable of receiving an incoming information signal from an antenna; and an amplifier, associated with said receiver front-end circuit, having a plurality of amplification stages, at least one of said amplification stages having an impedance-peaking current mirror comprising:

a N-channel drive transistor having a source coupled to ground, a drain coupled to a current source and a gate coupled to said drain via a series connection of a resistor and an inductor; and a N-channel mirror transistor having a source coupled to ground, a gate coupled to said drain of said N-channel drive transistor, and a drain coupled to a positive power supply via an impedance load.

8. The receiver as set forth in claim 7 wherein said series connection of said resistor and said inductor operate as a short circuit at relatively low frequencies such that the gate to source voltage of said drive transistor is substantially equal to the gate to source voltage of said mirror transistor at relatively low frequencies.

9. The receiver as set forth in claim 8 wherein said series connection of said resistor and said inductor operate as a high impedance at relatively high frequencies, thereby isolating the gate to source capacitance of said drive transistor from the gate to source capacitance of said mirror transistor at relatively high frequencies.

10. A method of operating an impedance-peaking current mirror, said impedance-peaking current mirror comprising (i) N-channel drive transistor having a source coupled to ground, a drain coupled to a current source and a gate coupled to said drain via a series connection of a resistor and an inductor, and (ii) a N-channel mirror transistor having a source coupled to ground, a gate coupled to said drain of said N-channel drive transistor, and a drain coupled to a positive power supply via an impedance load, said method of operation comprising the step of operating said impedance-peaking current mirror at a sufficiently high frequency to increase the impedance of said inductor thereby isolating the gate to source capacitance of said drive transistor from the gate to source capacitance of said mirror transistor at relatively high frequencies.

11. An impedance-peaking current mirror comprising:

a P-channel drive transistor having a source coupled to a positive power supply, a drain coupled to a current source and a gate coupled to said drain via a series connection of a resistor and an inductor; and a P-channel mirror transistor having a source coupled to said positive power supply, a gate coupled to said drain of said P-channel drive transistor, and a drain coupled to ground via an impedance load.

12. The impedance-peaking current mirror as set forth in claim 11 wherein said series connection of said resistor and said inductor operate as a short circuit at relatively low frequencies such that the gate to source voltage of said drive transistor is substantially equal to the gate to source voltage of said mirror transistor at relatively low frequencies.

13. The impedance-peaking current mirror as set forth in claim 12 wherein said series connection of said resistor and said inductor operate as a high impedance at relatively high frequencies, thereby isolating the gate to source capacitance of said drive transistor from the gate to source capacitance of said mirror transistor at relatively high frequencies.

14. An amplifier having a plurality of amplification stages, at least one of said amplification stages having an impedance-peaking current mirror comprising:

a P-channel drive transistor having a source coupled to a positive power supply, a drain coupled to a current source and a gate coupled to said drain via a series connection of a resistor and an inductor; and a P-channel mirror transistor having a source coupled to said positive power supply, a gate coupled to said drain of said P-channel drive transistor, and a drain coupled to ground via an impedance load.

15. The amplifier as set forth in claim 14 wherein said series connection of said resistor and said inductor operate as a short circuit at relatively low frequencies such that the gate to source voltage of said drive transistor is substantially equal to the gate to source voltage of said mirror transistor at relatively low frequencies.

16. The amplifier as set forth in claim 15 wherein said series connection of said resistor and said inductor operate as a high impedance at relatively high frequencies, thereby isolating the gate to source capacitance of said drive transistor from the gate to source capacitance of said mirror transistor at relatively high frequencies.

17. A receiver comprising:

a receiver front-end circuit capable of receiving an incoming information signal from an antenna; and an amplifier, associated with said receiver front-end circuit, having a plurality of amplification stages, at least one of said amplification stages having an impedance-peaking current mirror comprising:

a P-channel drive transistor having a source coupled to a positive power supply, a drain coupled to a current source and a gate coupled to said drain via a series connection of a resistor and an inductor; and a P-channel mirror transistor having a source coupled to said positive power supply, a gate coupled to said drain of said P-channel drive transistor, and a drain coupled to ground via an impedance load.

18. The receiver as set forth in claim 17 wherein said series connection of said resistor and said inductor operate as a short circuit at relatively low frequencies such that the gate to source voltage of said drive transistor is substantially equal to the gate to source voltage of said mirror transistor at relatively low frequencies.

19. The receiver as set forth in claim 18 wherein said series connection of said resistor and said inductor operate as a high impedance at relatively high frequencies, thereby isolating the gate to source capacitance of said drive transistor from the gate to source capacitance of said mirror transistor at relatively high frequencies.

20. A method of operating an impedance-peaking current mirror, said impedance-peaking current mirror comprising (i) a P-channel drive transistor having a source coupled to a positive power supply, a drain coupled to a current source and a gate coupled to said drain via a series connection of a resistor and an inductor, and (ii) a P-channel mirror transistor having a source coupled to said positive power supply, a gate coupled to said drain of said P-channel drive transistor, and a drain coupled to ground via an impedance load, said method of operation comprising the step of operating said impedance-peaking current mirror at a sufficiently high frequency to increase the impedance of said inductor thereby isolating the gate to source capacitance of said drive transistor from the gate to source capacitance of said mirror transistor at relatively high frequencies.

* * * * *